(12) United States Patent
Wilhelmsson et al.

(10) Patent No.: US 9,143,177 B2
(45) Date of Patent: Sep. 22, 2015

(54) TECHNIQUE FOR AUTOMATIC GAIN CONTROL

(75) Inventors: Leif Wilhelmsson, Dalby (SE); Bengt Lindoff, Bjärred (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 79 days.

(21) Appl. No.: 14/007,679

(22) PCT Filed: Mar. 28, 2012

(86) PCT No.: PCT/EP2012/055536
§ 371 (c)(1),
(2), (4) Date: Sep. 26, 2013

(87) PCT Pub. No.: WO2012/130896
PCT Pub. Date: Oct. 4, 2012

(65) Prior Publication Data
US 2014/0018027 A1   Jan. 16, 2014

Related U.S. Application Data

(60) Provisional application No. 61/474,010, filed on Apr. 11, 2011.

(30) Foreign Application Priority Data

Mar. 30, 2011   (EP) .................................. 11002640

(51) Int. Cl.
  *H04B 1/10*   (2006.01)
  *H04B 17/309*   (2015.01)
  *H04B 1/12*   (2006.01)
  *H03G 3/30*   (2006.01)
  (Continued)

(52) U.S. Cl.
  CPC .............. *H04B 1/123* (2013.01); *H03G 3/3052* (2013.01); *H03G 3/3078* (2013.01); *H04L 27/2647* (2013.01); *H04L 27/3809* (2013.01)

(58) Field of Classification Search
  USPC .......... 455/232.1, 234.1, 241.1, 242.1, 245.1, 455/245.2; 375/345
  See application file for complete search history.

(56) References Cited

U.S. PATENT DOCUMENTS 6,985,514 B2 * 1/2006 Zalio et al. .................... 375/147
7,263,143 B1   8/2007 Rothaar et al.
(Continued)

FOREIGN PATENT DOCUMENTS

EP   0 583 967 A2   2/1994
EP   1 398 930 A1   3/2004
(Continued)

OTHER PUBLICATIONS

International Search Report and Written Opinion dated Apr. 25, 2012 for International Application No. PCT/EP2012/055536, International Filing Date Mar. 28, 2012 consisting of 14-pages.

*Primary Examiner* — Blane J Jackson
(74) *Attorney, Agent, or Firm* — Christopher & Weisberg, P.A.

(57) ABSTRACT

A technique for performing Automatic Gain Control for a receiver (102) of a device (100) connected to a communication system is provided. As for a method embodiment, a method (200) comprises the steps of receiving (205) a signal using a gain setting (310; 410; 510; 610) of the receiver (102); at least partially decoding (210) the received signal (301; 401; 501; 601) to obtain a decoding result; and selecting (215) the gain setting based on the decoding result.

16 Claims, 8 Drawing Sheets

(51) Int. Cl.
*H04L 27/26* (2006.01)
*H04L 27/38* (2006.01)

(56) References Cited

U.S. PATENT DOCUMENTS

| | | | |
|---|---|---|---|
| 7,760,816 B2 * | 7/2010 | Sobchak et al. | 375/297 |
| 8,675,789 B2 * | 3/2014 | Seller | 375/345 |
| 2002/0155811 A1 | 10/2002 | Prismantas et al. | |
| 2003/0114126 A1 | 6/2003 | Wang et al. | |
| 2004/0264608 A1 | 12/2004 | Habuka et al. | |
| 2008/0144628 A1 | 6/2008 | Tsai et al. | |
| 2008/0292032 A1 | 11/2008 | Belogolovy et al. | |
| 2009/0075614 A1 * | 3/2009 | Lin et al. | 455/240.1 |
| 2009/0290516 A1 | 11/2009 | Han et al. | |

FOREIGN PATENT DOCUMENTS

| | | |
|---|---|---|
| EP | 1 612 952 A1 | 1/2006 |
| EP | 1 760 879 A2 | 3/2007 |
| GB | 2 371 690 A1 | 7/2002 |
| WO | 9634452 A1 | 10/1996 |

* cited by examiner ed signal. Alternatively or in addition, the

TECHNIQUE FOR AUTOMATIC GAIN CONTROL

TECHNICAL FIELD

The present disclosure generally relates to the field of controlling a gain of a receiver. In particular, the disclosure relates to a technique for automatically controlling a gain of a receiver in the presence of intermittent interference.

BACKGROUND

State of the art receivers for wireless communication (e.g., in mobile terminals or base stations), operated in accordance with the Global System for Mobile communication (GSM), Wideband Code Division Multiple Access (WCDMA), or Long Term Evolution (LTE, including evolved UMTS Terrestrial Radio Access Networks, or E-UTRANs), are equipped with Automatic Gain Control (AGC). The AGC is used to ensure that a signal received by the receiver is processed at a suitable signal level (also referred to a signal power). In this regard, the AGC scales the received signal such that the signal can be represented by a limited number of bits for digital processing without significant loss of information. The receiver gain determined by the AGC should be large enough to minimize quantization noise. At the same time, the AGC should ensure that the scaled signal does not exceed a maximum range of the digital processing, i.e., that the processing in the receiver or in a downstream processing stage does not get saturated.

FIG. 1 schematically shows a received signal 10 interfered by bursts of an intermittent interference 12. In case the intermittent interference 12 is sufficiently distant in frequency space from the signal 10 to be received, the interference 12 might be sufficiently attenuated by means of an analog filter, so that its impact on the digital processing of the received signal 10 is marginal. Otherwise, the AGC has to take into account interference 12 that is close in frequency space, or inside the spectrum of signal reception, even if the interference 12 could be attenuated by the digital processing.

The AGC determines the receiver gain depending on both the signal to be received and the interference 12. In case the received power of the interference 12 is considerably larger than the received power of the signal 10, the receiver gain determined by the AGC essentially depends on the received power of the interference 12. Thus, the receiver gain is significantly reduced from a receiver gain 14, which is appropriate when only the signal 10 is received, to a receiver gain 16 determined by the interference 12.

The gain reduction in a stage of the receiver prior to the digital processing is detrimental to signal quality and increases quantization noise, as is expressed by the Friis formula for noise. As a quantitative example, for a signal amplitude $A_{signal}$ and an interference amplitude $A_{interference}$, a number of B bits is lost in a dynamic range of the digital processing, wherein $A_{signal}/A_{interference} = 2^{-B}$. This fact is related to a difference in the received power of the signal 10 and the interference 12, which difference is $20 \cdot \log_{10}(A_{interference}/A_{signal})$ dB=$6.02 \cdot B$ dB. In case the interference 12 would be 30 dB stronger than the signal 10, the conventional AGC would shift the dynamical range by B=5 bits in order to prevent saturation. Due to a "conservative" updating of the old receiver gain settings 14 to the new receiver gain setting 16 at time $t_1$, the loss in dynamic range of B=5 bits for the digital processing covers a time interval from time $t_1$ to time $t_2$.

Requirements on power consumption and hardware resources typically limit an available dynamic range of, for example, a mobile terminal to effectively 60 dB or approximately 10 bits. Such a loss in the order of half of the available dynamic range is detrimental to processing the signal 10 received using the reduced receiver gain 16. Consequently, signal reception may be impeded not only during presence of the interference 12, but even beyond in the time interval from time $t_1$ to time $t_2$, as well as the time following $t_3$. As a result, a communication can be temporarily interrupted or may even break down.

For the case of periodic interference described in U.S. Pat. No. 7,263,143 B1, an occurrence of interference events might be predictable. The AGC can be improved under such specific conditions based on the prediction. In a more general random interference scenario, the conventional AGC technique is expected to still suffer from the loss of dynamic range.

SUMMARY

Accordingly, it is an object to provide a technique for automatically controlling the gain of a receiver, which is not specifically limited to periodic interference scenarios.

According to a first aspect, a method of performing Automatic Gain Control, (AGC), for a receiver of a device connected to a communication system is provided. The method comprises the steps of receiving a signal using a gain setting of the receiver; at least partially decoding the received signal to obtain a decoding result; and selecting the gain setting based on the decoding result. The selection may comprise updating (e.g., changing) the gain setting, maintaining the gain setting, and so on.

The received signal may be subject to interference, and the step of selecting the gain setting may include a gain setting updating procedure. The updating can (e.g., exclusively) depend on the decoding result. The updating does not need to rely on a periodic interference. As an advantage, the technique may significantly improve signal reception, including in more general interference scenarios. The interference may be periodic or more complex. The interference may also be an intermittent interference. The intermittent interference may be aperiodic or random.

Based on the at least partial decoding, a decoding result is obtained and the updating may be based on the decoding result in a feed-forward way. The latter may be particularly useful when the interference is repetitive. The interference may (additionally) be predicted. Alternatively or in addition, the updating of the gain setting may be based on the decoding result in a feed-back way. The latter may be particularly useful when the interference is less predictable or not predictable at all.

The decoding result can indicate at least one of success and failure of the decoding. The indication of at least one of success and failure may include (quantitatively) indicating a degree of at least one of success and failure. The decoding may comprise a decoding algorithm, preferably a Viterbi decoding algorithm or a turbo decoding algorithm. The decoding result may include a metric of the decoding algorithm (as the quantitative indication, also referred to as a continuous indication). The metric can be a Hamming metric, an Euclidean metric or a (Viterbi) path metric. Furthermore, the (quantitative) indication may include two or more metrics, preferably a difference between a first metric of a most probable (decoding) state and a second metric of a second most probable (decoding) state. Alternatively or in addition, the decoding result may include a Cyclic Redundancy Check (CRC) of the received signal or the at least partially decoded signal. By way of example, the quantitative indication being equal to 0.7 in a range of 0 to 1 may indicate a rate (or a probability) of 30% for failure and 70% of success. As an alternative example, the quantitative indication being equal to 0.4 in a range of −1 to +1 may indicate a rate (or a probability) of 30% for failure and 70% of success.

The maintaining of the gain setting may also include a minor change or a not substantial change. As an example, the change may be suppressed. The change may be equal to or less than half of a conventional AGC response. For example, the gain setting may change to an extent that is significantly less than a change the Automatic Gain Control (AGC) would normally apply under a corresponding interference, e.g., a corresponding interference burst. By way of example, the change may be only 10% to 20%, or less, then that of a conventional AGC response.

Alternatively or in addition, maintaining the gain setting may include the case of a transient change of the gain setting. The gain setting may be changed (e.g., in response to an increased signal input level and/or the presence of interference) and may return to a prior gain setting. The gain setting may return to at least substantially the gain setting prior to the change. The gain setting may return when or before the interference becomes absent. For example, the gain setting may be changed and the change may be undone in response to detecting the presence of interference (e.g., by the decoding failure). As another example, the gain setting may be changed and the change may be undone in response to detecting the absence of the interference (e.g., by the success of the decoding).

The gain setting of the receiver may be updated (only) in the absence of an interference in the received signal. The updating may be postponed until the absence of the interference. The success of the decoding may indicate the absence of the interference. Alternatively or in addition, in the steps of selecting the gain setting, the gain setting of the receiver may be maintained (e.g., "freezed") in the presence of an interference in the received signal. The failure of the decoding may indicate the presence of the interference.

Alternatively or in addition, the decoding result or any other result (collectively referred to as indications) may indicate at least one of the presence or the absence of the interference. There exist numerous interference indications.

A signal-to-noise ratio of the received signal may be estimated (e.g., as a further indication). Alternatively or in addition, an error rate of the received signal may be estimated (e.g., as a further indication).

Alternatively or in addition, a Fourier component of the received signal may be determined (e.g., as a further indication). The Fourier component may be determined at a predefined interference frequency. The Fourier component may also be determined (e.g., by numerical integration) in a predefined interference spectrum.

Alternatively or in addition, the received signal may be matched to a pre-defined interference pattern. A plurality of pre-defined interference pattern may be encoded in a memory of the device. A match may indicate the presence of an interference.

Alternatively or in addition, an increase of received power may be measured (e.g., as a further indication). The received power may be measured periodically. An increase of the received power within one period, two periods or few periods, may indicate the presence of the interference. The gain setting may be updated based on the periodic measurement or any other measurement of the received power. The updating may be delayed with respect to the measurement by a delay time. The delay time may (essentially) correspond to a time period of the decoding.

Two or more of the indications may be at least one of numerically weighted and logically combined. Any results indicating the presence or the absence of the interference, including results disclosed individually or for certain embodiments, may be combined.

The gain setting may be updated based on a hysteretic analysis of the received power. Alternatively or in addition, the gain setting may be updated based on an integration time of the received power. In one implementation, the gain setting is updated based on a running average of the received power.

The received signal may be transmitted on a channel of the communication system having a predefined (e.g., the lowest) error correction rate (e.g., of all channels of the communication system). The received signal may be transmitted on a control channel of the communication system.

The gain setting may be applied to the receiver at different stages of a receiver path in the device. As an example, the gain setting may be applied to the receiver at a receiver stage prior to an analog-to-digital converter.

The technique presented herein can be practiced in the form of hardware, in the form of software, and in the form of a combined hardware/software approach. As for a software aspect, a computer program product is provided. The computer program product comprises program code portions for performing one or more of the steps of the technique described therein, when the computer program product is run on one or more components of the device, the communication system, or a network. The computer program product may be stored on a computer readable recording medium.

As for a hardware aspect, a device for performing Automatic Gain Control, or AGC, for a receiver of the device connected to a communication system is provided. The device comprises a receiver adapted to receive a signal using a gain setting of the receiver; a decoding unit adapted to at least partially decode the received signal to obtain a decoding result; and an AGC unit adapted to select the gain setting based on the decoding result.

The device may be a stationary terminal device or a mobile terminal. As an example, the device may be an LTE UMTS User Equipment (UE). Alternatively, the device can be a base station, particularly a "Node B" or an "Enhanced Node B" (also referred to as "eNodeB"). The communication system may enable a wireless (e.g., a mobile) communication.

At least one of the receiver, the decoding unit, the AGC unit, and a specific functional unit may be adapted to perform one or more of the steps of the method and the technique described herein. Particularly, the decoding result may indicate at least one of success and failure of the decoding. The AGC unit may further be adapted to select the gain setting by updating the gain setting of the receiver (e.g., only) in the absence of an interference in the received signal. The success of the decoding may indicate the absence of the interference.

BRIEF DESCRIPTION OF THE DRAWINGS

In the following, the disclosure will be described with reference to exemplary embodiments illustrated in the drawings, wherein.

DESCRIPTION OF PREFERRED EMBODIMENTS

In the following, for purposes of explanation and not limitation, specific details are set forth, such as particular sequences of steps, interfaces and configurations, in order to provide a source of understanding of the disclosure. It will be apparent to one skilled in the art that the invention may be practiced in other embodiments that depart from these specific details. For example, while the embodiments will be described with reference to an LTE communication system, it will be apparent to the skilled person that the invention can also be practiced in the context of other communication systems.

Moreover, those skilled in the art will appreciate that the functions and processes explained herein below may be implemented using software functioning in conjunction with a program microprocessor or with a general purpose computer. It will also be appreciated that while the embodiments are primarily described in form a methods and devices, the invention may also be embodied in a computer program product as well as in a system comprising a computer processor and a memory coupled to the processor, wherein the memory is encoded with one or more programs that may perform the functions disclosed therein.

Figure 1:
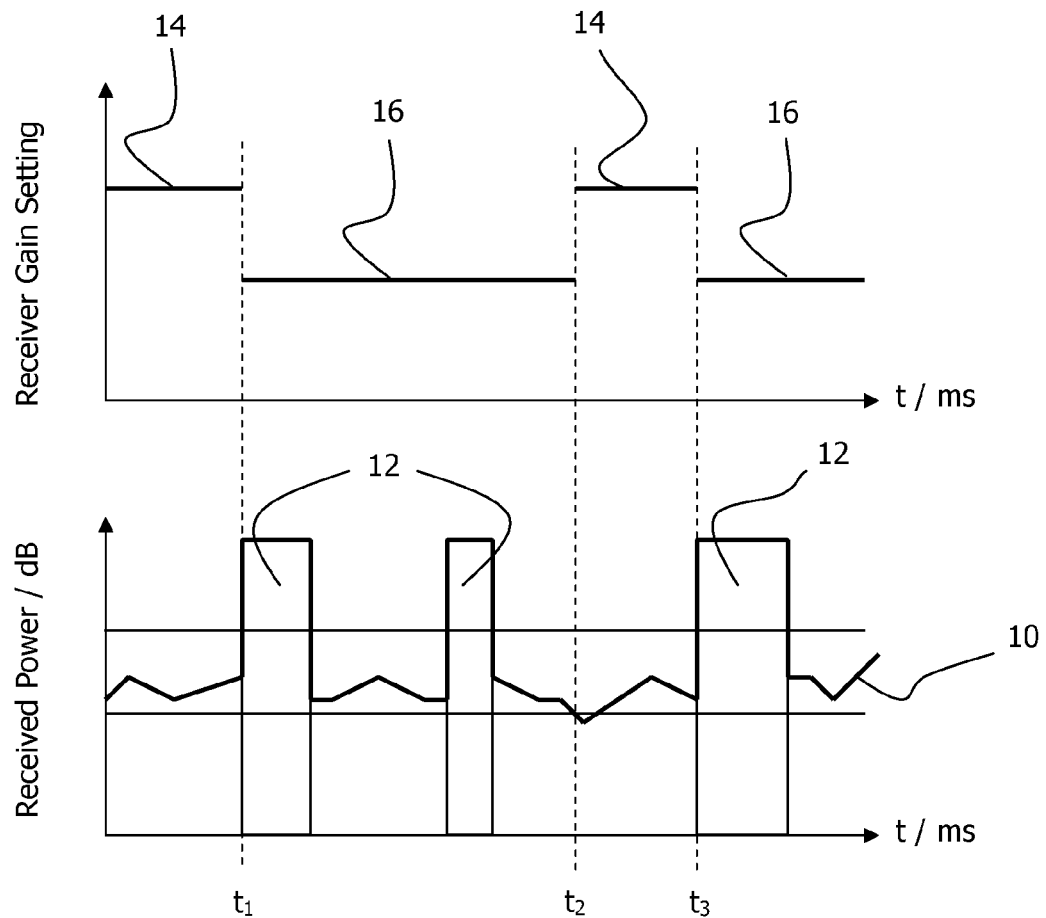
FIG. 1 is a schematic diagram illustrating a receiver gain setting of a conventional AGC technique in the presence of intermittent interference.
Figure 2:
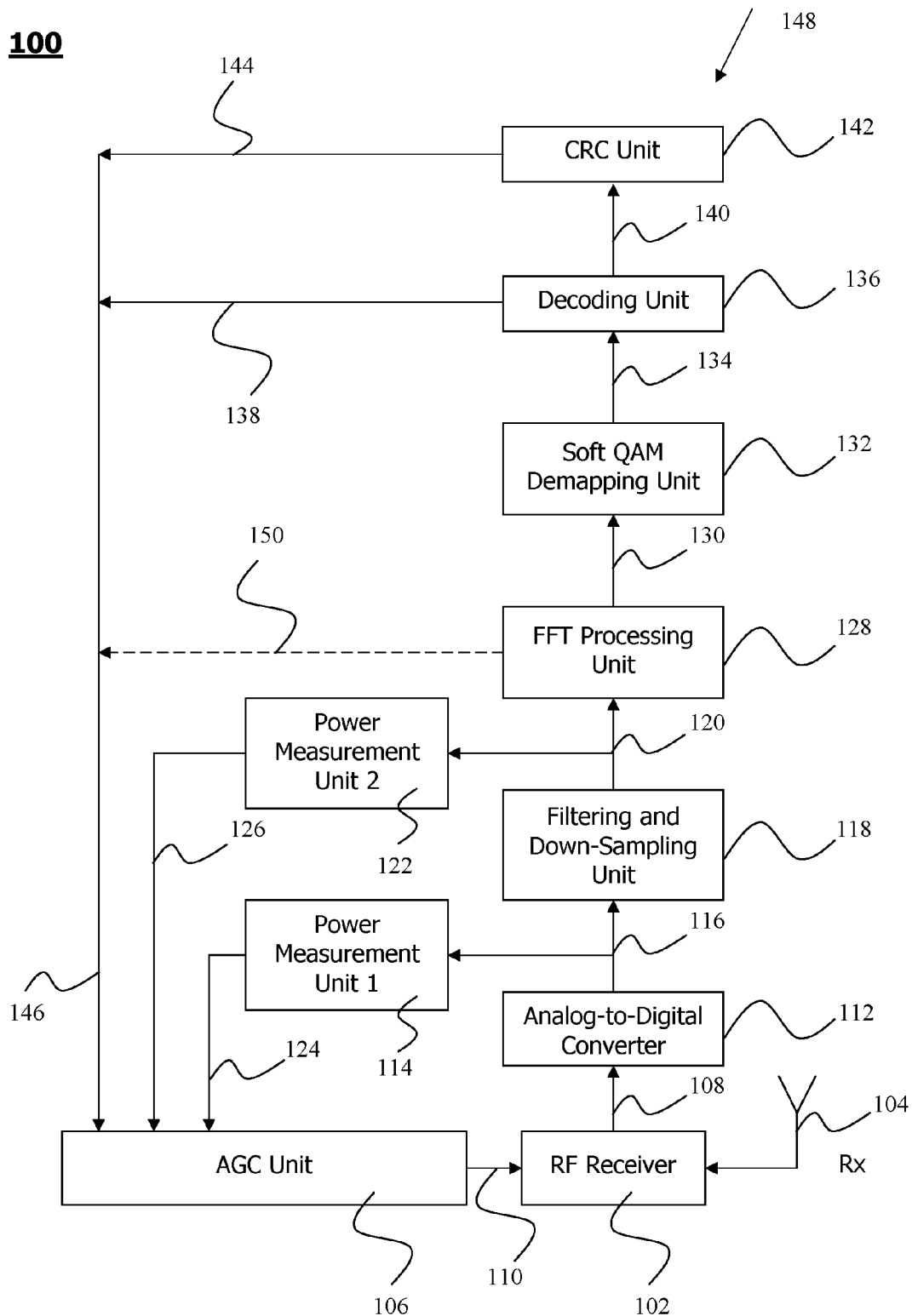
FIG. 2 is a schematic block diagram illustrating a first embodiment of a device for controlling a gain of a receiver.

FIG. 2 shows a schematic block diagram illustrating an embodiment of a device 100 for performing Automatic Gain Control (AGC). The device 100 can be stationary. In particular, the device 100 can be located at an Evolved Node B ("eNodeB") for wireless communication according to the LTE standard. In a complementary embodiment, the device 100 is a mobile terminal or part of a mobile terminal for wireless communication.

The device 100 comprises a radio frequency receiver 102 coupled to a receiver antenna 104 and an AGC unit 106. The receiver 102 is adapted to receive a radio frequency signal via the receiver antenna 104 and to filter the radio frequency signal by means of an analog filter (not shown). The receiver 102 outputs on an analog signal line 108 the received signal that was internally scaled according to a receiver gain setting. The receiver gain setting is signaled from the AGC unit 106 via a gain line 110 to the receiver 102.

The received signal on the analog signal 108 is converted into a digital received signal by an analog-to-digital converter 112. For a mobile embodiment of the device 100, the analog-to-digital converter 112 provides a dynamic range for sampling the received signal on the analog signal 108, using 6 to 10 bits, for example at 6 bits, 8 bits, or 10 bits. For a stationary embodiment of the device 100, the analog-to-digital converter 112 provides a dynamic range of 10 to 18 bits, for example 12 to 18 bits, for example 12 or 18 bits.

The device 100 further comprises a first power measurement unit 114 adapted to derive a first received power estimate based on the digital received signal provided by the analog-to-digital converter 112 on a digital signal line 116. The digital received signal is input to a filtering and down-sampling unit 118. The filtering and down-sampling unit 118 is adapted to convolute the digital received signal on the digital line 116. The convolution may include a frequency filter (including filter components proportional to sin (2n·f)/f). The frequency filter may be adapted to eliminate interference at a frequency close to one or more sub-carriers used by the communication system. The filtered received signal is output (at a reduced sampling frequency) on a time-domain processing line 120.

A second power measurement unit 122 is adapted to derive a second received power estimate based on the filtered received signal on the time-domain processing line 120.

The first power measurement unit 114 and the second power measurement unit 122 are adapted to output the first received power estimate and the second received power estimate on a first power estimate line 124 and a second power estimate line 126, respectively. The first received power estimate and the second received power estimate are input to the AGC unit 106.

A Fast Fourier Transformation processing unit 128 (FFT processing unit) outputs the result of a Fourier transformation on a frequency-domain processing line 130. A soft Quadrature Amplitude Modulation demapping unit 132 (Soft QAM demapping unit) assigns soft bit values to the received signal on the frequency-domain processing line 130. The soft bits are output on a soft bit sequence line 134. A decoding unit 136 is adapted to perform a decoding algorithm based on a sequence of soft bits on the soft bit sequence line 134.

In the embodiment shown in FIG. 2, the decoding algorithm might be a Viterbi decoding algorithm. The Viterbi decoding algorithm is applied to signals received, for example, on a control channel of the communication system. The decoding unit 136 might also be a turbo decoding algorithm to received signals on a data channel of the communication system. The decoding unit 136 outputs a metric of the decoding algorithm (as part of a decoding result) on a decoding result line 138. The decoding unit 136 outputs a sequence of hard bits on a hard bit sequence line 140.

A Cyclic Redundancy Check unit 142 (CRC unit) is adapted to compute a checksum (also referred to as a check value) for the received signal (as represented by the bit sequence on the hard bit sequence line 140). The CRC unit 142 outputs the check-sum on a CRC line 144.

In a reduced embodiment of the device 100, the decoding result of the decoding unit 136 on the decoding results line 138 is a single bit value representing success (by bit value 0 indicating the absence of interference) or failure (by bit value 1 indicating the presence of interference) of the decoding. The checksum of the CRC unit 142 on the CRC line 144 is also a single bit value representative of an error detected in the received (and decoded) signal (by bit value 1 indicating the presence of interference). The decoding result and the checksum are logically combined according to a logical "OR" (i.e., inclusive disjunction) onto an indication line 146. The indication line 146 thus indicates (by bit value 0) a successfully decoded signal that is (most likely) free of bit errors.

The indication line 146, the first power estimate line 124 and the second power estimate line are input to the AGC unit 106. The AGC unit 106 is adapted to derive a gain setting based on the indication (on the indication line 146), the first received power estimate (on the first power estimate line 124), and the second received power estimate (on the second power estimate line 126). The gain setting is output on the gain line 110 from the AGC unit 106 to the receiver 102. The AGC unit derives the gain setting based on the first and second received power estimates to ensure that the received signal, as scaled by the receiver 102, reaches the analog-to-digital converter 112 on the analog signal line 108 at a suitable signal level.

In the absence of interference in the received signal, the gain setting derived by the AGC unit 106 is such that the received signal on the analog signal line 108 is sufficiently strong to minimize an effect of quantization noise in the analog-to-digital converter 112. In order to prevent saturation of the analog-to-digital converter 112 a "headroom", i.e. an additional scope in dynamic range, is provided by the gain setting to ensure that a probability for the saturation, i.e. the signal on the analog signal line 108 exceeding a maximum range of the analog-to-digital converter 112, is sufficiently small. The "headroom" is estimated by the AGC unit 106 based, for instance, on a temporal average of the first and second received power estimates. In frequency space, it is not sufficient to only consider the spectral range used by the communication system. For the frequency filtering performed by the filtering and down-sampling unit 118 (or alternatively by the FFT processing unit 128) eliminating an interference close in frequency to the spectral range of the communication system, the interference has to be within the dynamic range of the analog-to-digital converter 112.

In the embodiment of the device 100 shown in FIG. 2, the gain setting is applied to the receiver 102 at an early stage in a processing chain 148 (also referred to as receiver path). The processing chain 148 comprises the components 102, 112, 118, 128, 132, 136 and, optionally, the CRC unit 142. In an alternative embodiment of the device 100, the receiver gain setting comprises a plurality of gain values, each of which is applied in the processing chain 148 at different stages or components. In a further alternative embodiment of the device 100, each of the plurality of gain values is applied to different stages (i.e., distributed AGC stages) in the receiver 102.

In an extended embodiment of the device 100, the FFT processing unit 128 is further adapted to determine a Fourier component of the received signal at a pre-defined different frequency or within a pre-defined interference spectrum. The Fourier component is output on a Fourier component line 150. The Fourier component can be a single bit value indicating the presence or the absence of an intermittent interference, such as the interference close in frequency. Exceeding or falling below, a pre-defined interference threshold indicates either the presence or the absence of the intermittent interference, respectively.

In a further extended embodiment of the device 100, the decoding result on the decoding result line 138 and the Fourier component on the Fourier component line 150 are signals representative of probabilities. The Fourier components provided by the FFT processing unit 128, represents the probability for the presence of an intermittent interference in the received signal. The decoding result provided by the decoding unit 138, represents the probability for the success of decoding the received signal. The checksum (on the CRC line 144), the decoding result (on the decoding result line 138) and the Fourier component (on the Fourier component line 150) are weighted and summed-up to an indication (on the indication line 146) representative of a (total) probability for the presence of an intermittent interference.

Figure 3:
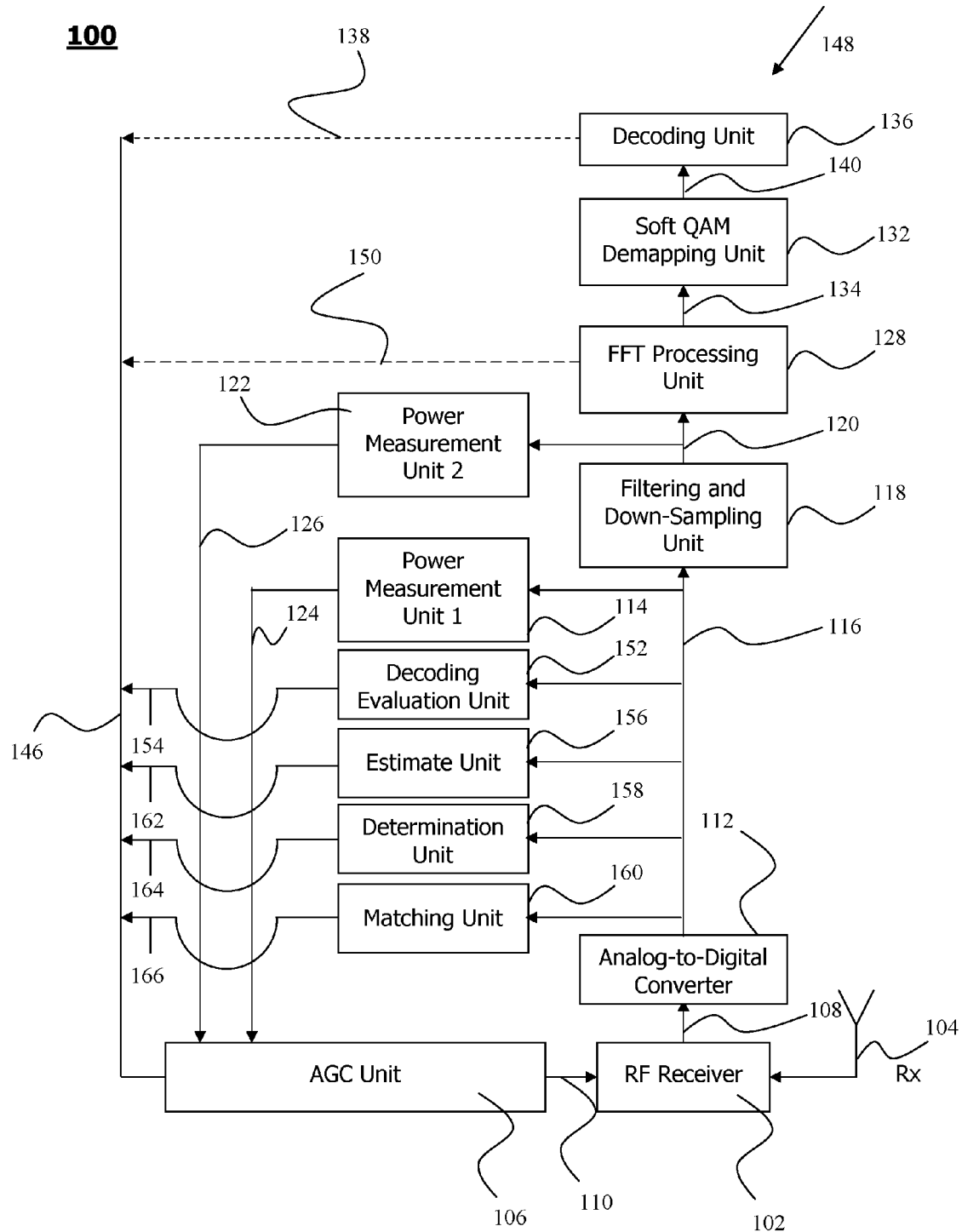
FIG. 3 is a schematic block diagram illustrating a second embodiment of a device for controlling a gain of a receiver.

FIG. 3 shows a second embodiment of a device 100. Like reference signs in the FIGS. 2 and 3 refer to like (and mutually exchangeable) features or components as described above with reference to FIG. 2. The first embodiment of the device 100, as shown in FIG. 2, uses (exclusively) the decoding unit 136 in the processing chain 148 for providing a decoding result on a decoding result line 138. The decoding unit 136 is a stage in the processing chain 148 downstream with respect to the power measurement units 114, 122. The second embodiment of the device 100 (additionally) comprises a decoding evaluation unit 152 that is adapted to output the decoding result (as a preliminary decoding result) on the decoding evaluation line 154.

The decoding evaluation unit 152 in the second embodiment branches off the processing chain 148 upstream to the power measurement units 114, 122. As an advantage, a feed-back time is reduced. The feed-back time essentially contributes to a delay time for the updating of the gain setting. The delay time (also referred to as time lag) is a time difference between a reception time of the received signal, on which the decoding result (reaching the AGC unit 106) is based, and a (later) updating time, at which the gain setting (as derived by the AGC unit 106) is updated in the receiver 102. The delay time is due to the feed-back time required for the at least partial decoding and the derivation of the gain setting by the AGC unit 106. The delay time is further described below with reference to FIGS. 5 and 6.

In the second embodiment of the device 100, both the decoding result of the decoding unit 136 on the decoding line 138 and the decoding result of the decoding evaluation unit 152 on the decoding evaluation line 154 are input to the AGC unit 106. A reduced second embodiment of the device 100 dispenses with the decoding result line 138. In an extended second embodiment of the device 100, at least one of the decoding unit 136 and the decoding evaluation unit 152 are adapted to estimate an error rate of the received signal. The decoding result includes the error rate estimate for the received signal.

A further extended second embodiment of the device 100 includes alternatively or in addition to the decoding evaluation unit 152 at least one of an estimate unit 156, a determination unit 158, and a matching unit 160. Each of the estimate unit 156, the determination unit 158, and the matching unit 160 outputs an indication for the presence or absence of the intermittent interference on an estimate line 162, a determination line 164, and an a matching line 166, respectively. In a variant of the extended second embodiment of the device 100, the estimate unit 156 branches off the processing chain 148 downstream to the FFT processing unit 128 (at the frequency-domain processing line 130). More generally, the received signal is input to the estimate unit 156 in the frequency domain. Specifically, the signal is estimated prior to noise estimation.

The estimate unit 156 is adapted to estimate a signal-to-noise ratio for the received signal. More specifically, the estimate unit computes an average power of noise, $P_{noise}$, in the received signal on the digital signal line 116. Based on the first power estimate (representative of an average total power of the received signal), $P_1$, the signal-to-noise ratio is estimated according to $(P_1-P_{noise})/P_{noise}$. An indication derived from the signal-to-noise ratio is output on the estimate line 162.

The determination unit 158 is adapted to determine an intermittence frequency for the received signal. The intermittence frequency is an inverse of an intermittence time of the intermittent interference. The intermittence time is an average of time intervals between intermittent events, such as bursts, of the intermittent interference. Alternatively, the intermittence frequency is an average frequency of bursts of the intermittent interference. An intermittence time being shorter than a pre-defined intermittence time threshold indicates the presence of the intermittent interference. In a preferred embodiment, the AGC unit 106 applies an integration time (further described with reference to FIG. 7 below). An intermittence time being shorter than the integration time indicates the presence of the intermittent interference. Furthermore, an intermittence frequency corresponding to a standardized up-link/down-link frequency of TDD communications is an indication. Particularly, an intermittence time corresponding to 5 ms frames of LTE TDD communication is an indication. The indication is output on the determination line 164.

The matching unit 160 comprises a pattern memory (not shown). A set of pre-defined interference patterns is stored in the pattern memory. The pre-defined interference patterns define patterns (corresponding to potential sources of interference) in at least one of time and frequency. As an example, it can be assumed that Band 38 is used for Time Division Duplex (TDD) communications. Thus, one or more of the patterns represent temporal patterns corresponding to the TDD communications for a frequency range from 2570 MHz to 2620 MHz corresponding to Band 38. The matching unit 160 is adapted to match the received signal to each of the set of pre-defined interference patterns. That is, the matching unit 160 is adapted to check for a match. A (successful) match indicates the presence of an intermittent interference. A spectral distance of the received signal (used by the device 100 for its communication) to a spectral range used for LTE TDD communication can be an additional requirement of the indication. The matching unit 160 is further adapted to convolute the received signal with the pre-defined interference pattern. The (successful) match is indicated by the convolution exceeding a pre-defined matching threshold. Optionally, the matching unit is adapted to recognize a periodic pattern of interference. As a further example of TDD communications interfering with the received signal, such periodicity can be a changing of up-link and down-link channel in the TDD communications. Since a ratio of up-link period and down-link period is constant, future beginnings and endings of (bursts of) the intermittent interference are estimated by the matching unit 160. Optionally, the beginnings and endings of TDD up-link frames (as intermittent interference) are obtained through network signaling. The indication for the presence and the absence of the intermittent interference is output on the matching line 166.

As to a further indication, the first power measurement unit 116 or the second power measurement unit 122 periodically measure the received power of the received signal. A period of the received power measurement is 0.5 ms or more, preferably (approximately) 1 ms. A rapid increase of the received power indicates the presence of an intermittent interference. In a preferred embodiment, an increase within one period, two periods or few periods (of the received power measurement) is an indication. In other words, an increase in received power in conjunction with a received signal that has previously been relatively weak or is expected to be relatively weak, is an indication. The indication is output on at least one of the first power estimate line 124 and the second power estimate line 126 to the AGC unit 106. Alternatively or in addition, a sequence of samples of the received power, preferably sampled at 1 ms intervals, is provided to the matching unit 160. The matching unit 160 is adapted to estimate a frame structure of a TDD communication based on the samples.

Figure 4:
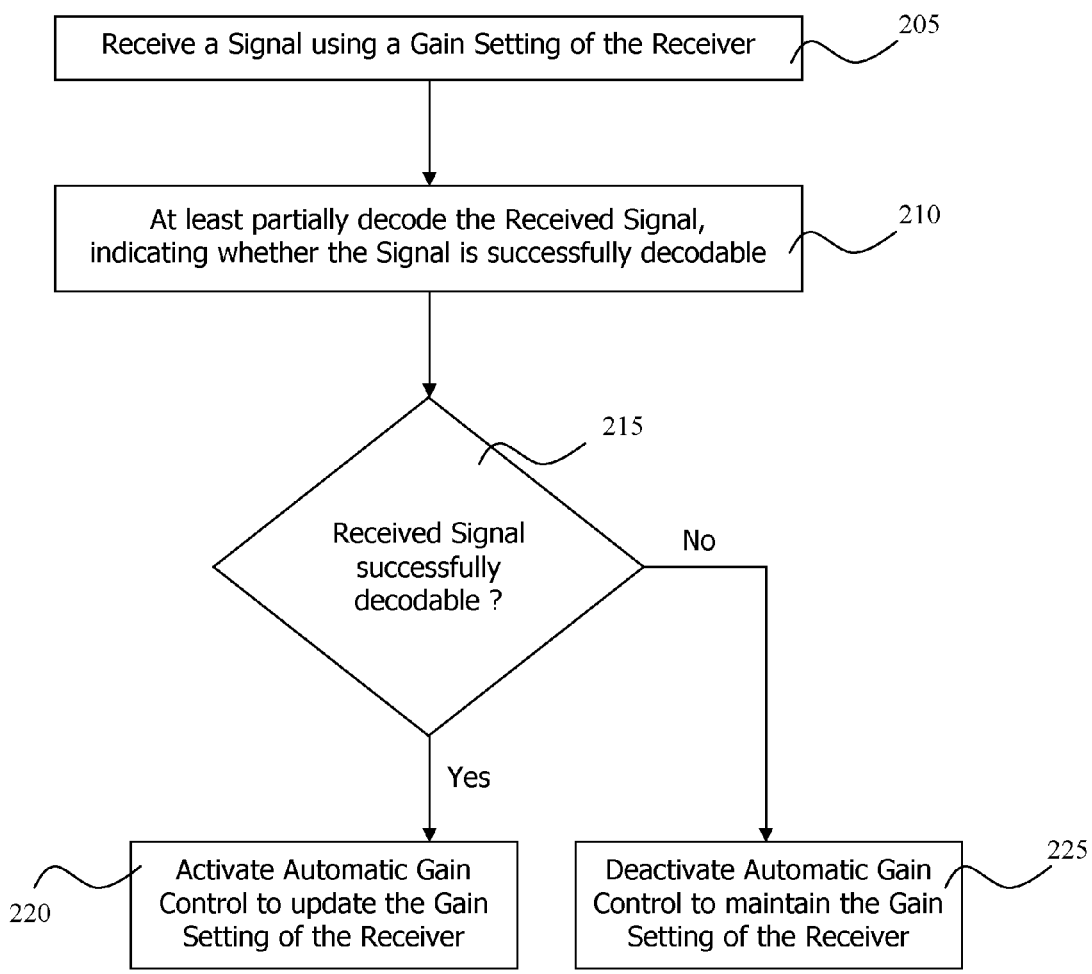
FIG. 4 is a flow chart illustrating a method embodiment of a method for controlling a gain of a receiver.

FIG. 4 shows a flow chart illustrating a method embodiment of a method 200 of performing AGC. The method 200 may, for example, be performed by the device 100 of any embodiment.

The method 200 starts in step 205 by receiving a signal (at the device 100) using a gain setting of the receiver 102. The received signal is at least partially (or preliminarily) decoded in step 210 by at least one of the decoding unit 136 and the decoding evaluation unit 152. The received signal is only decoded to an extent necessary to determine whether or not the received signal is decodable. Decodability means that the received signal has been successfully decoded or the at least partial decoding indicates that it is possible to successfully decode the received signal.

As a result of step 210, the decodability of the received signal is indicated to the AGC unit 106. According to a selection step 215, the AGC unit 106 selects to perform AGC in step 220 in case the received signal is decodable.

Performing AGC includes deriving a receiver gain setting for the receiver 102 based on at least one of the first power estimate and the second power estimate. The AGC unit 106 derives the receiver gain setting to be essentially reciprocal to the first and the second power estimates. Performing AGC further includes updating (also referred to as "applying") the derived receiver gain setting. Otherwise, in the case of a negative decision 215, it is selected to maintain the gain setting of the receiver unchanged according to step 225.

The gain setting may be exactly maintained. An exact maintaining is usually not required. The maintaining of the gain setting may also include a minor change or a not substantial change. Therefore, maintaining the gain setting may include a suppressed change, which is significantly less than the change that a conventional AGC would perform under corresponding conditions of interference. Maintaining is to be understood to include some "tolerance", e.g. a non-substantial change. By way of example, a slow drift in the signal level (which needs not to be related to interference) may be taken into account, e.g. by means of extrapolation during the presence of the interference.

Alternatively or in addition, maintaining the gain setting may include the case of a transient change of the gain setting. In a variant, the AGC is always performed. For example, the AGC keeps updating the gain setting in a conventional manner. In addition, the gain setting is stored. By way of example, the gain setting is always stored prior to a change performed by the AGC and/or the gain setting is stored for a predefined period of time (e.g., T=1 ms). As long as the CRC result indicates no error, the AGC keeps updating the gain setting and the stored gain setting is also updated (e.g., according to a sliding time frame of duration T). If it is determined in the selection step 215 that the signal is not decodable (e.g., by means of a CRC indicating a failure), the gain setting is then reset to the stored gain setting (e.g., to the level at the time T ago, or to the level prior to the change performed by the AGC). In other words, the AGC effectively maintains the gain setting by means of a transient change.

The variant has the advantage that the receiver uses the "wrong" gain setting only until the CRC indicates an error. The effect in the presence of the interference is as described above. Advantageously, the AGC performance is not affected in the absence of interference. E.g., there is no delay, because the AGC does not have to wait for the CRC result indicating no error.

As an advantage, the received signal between the bursts of the intermittent interference can be successfully processed. Typically, the received signal comprises some redundancy, such as forward-error-correction. Depending on a temporal fraction of the presence and the absence of the intermittent interference, the successfully processed signal is sufficient to maintain a communication link.

In a minimal embodiment of the method 200, the selection decision 215 is exclusively based on the decodability. In another embodiment of the method 200, the selection decision 215 takes into account further indications for the presence and the absence of the intermittent interference. The indications can be quantitative, including a positive value for the absence and a negative value for the presence of the intermittent interference. The decodability is represented by one or more of the indications. A weight is assigned to each of the indications. The weight represents a reliability of the indication (to which it is assigned). All indications are weighted and added up. The decision 215 is based on the added indications.

The steps 205 to 215 of the method 200 are repeated. In one embodiment of the method 200, the steps 205 to 215 are continuously performed or periodically repeated. The steps 220 and 225 are intermittently (and alternately) performed depending on the outcome of the decision 215. Thus, the gain setting in the step 205 of signal reception may be a result of a previous step 220 of updating the gain setting.

For the above embodiment of the method 200, the selection decision 215 is based on decoding a control channel. The control channel is a High Speed Shared Control Channel (HS-SCCH) in the case of a High Speed Downlink Packet Access (HSDPA) communication system. Furthermore, the control channel is a Physical Downlink Control Channel (PDCCH) in the case of an LTE communication system. That is, (at least) the received signal used for the at least partial decoding in the step 210 is transmitted on the control channel of the communication system. Decoding the control channel can comprise detecting the control channel. The control channel detection is also referred to as a demodulation.

Alternatively or in addition, a data channel is used for the decoding in the step 210. An advantage of using the control channel (as compared to using the data channel) is that the data channel, in case a Hybrid Automatic Repeat Request (HARQ) is enabled, can operate at a relatively high Block Error Rate (BLER) of approximately 10% to 30%. The control channel is regularly operated at a low BLER, compared to the Data Channel, typically below 0.1%. Hence, success and failure of the decoding have a higher correlation to presence and absence of the intermittent interference on the control channel (compared to the data channel). A risk for false detection of interference can be further reduced by additionally basing the selection decision 215 on the further indications.

Figure 5:
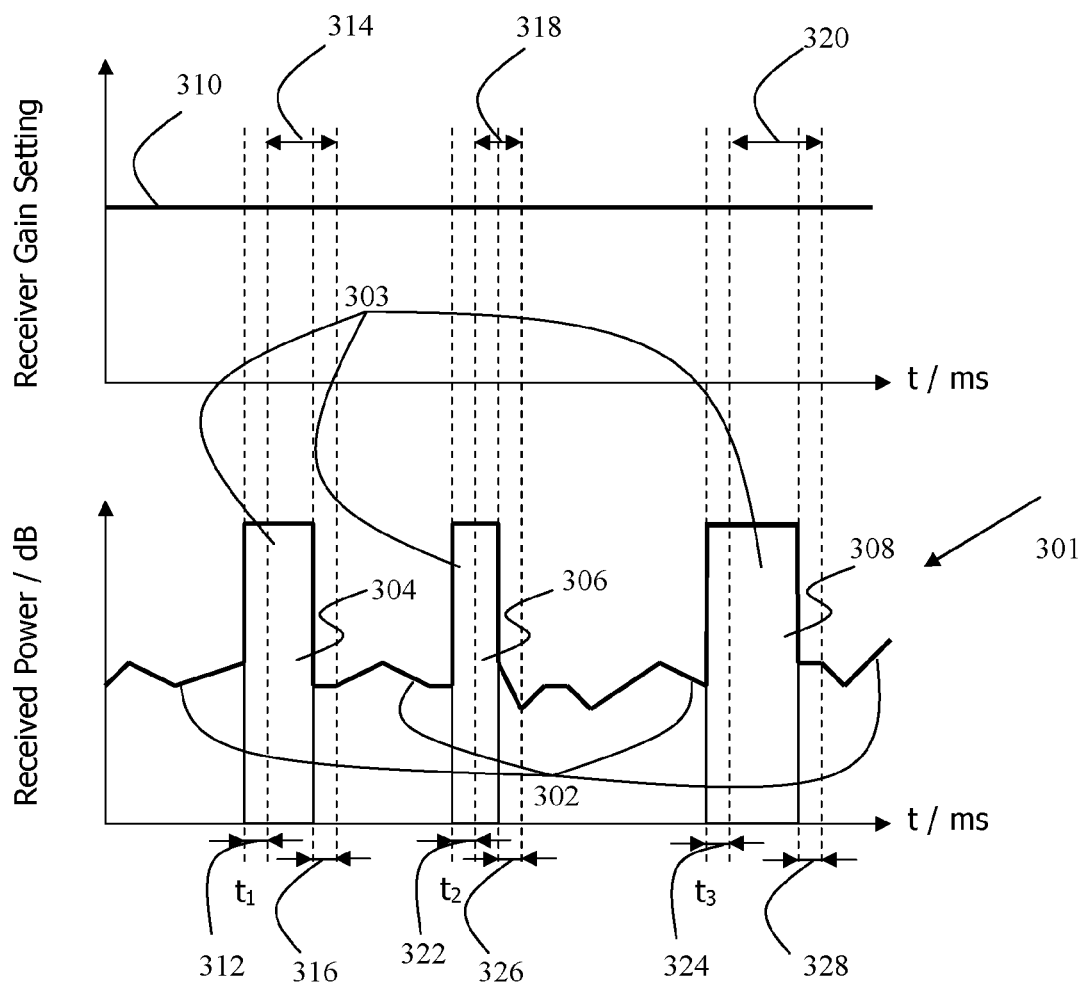
FIG. 5 is a diagram schematically illustrating a receiver gain setting in the presence of intermittent interference as a result of the technique of the present disclosure.

FIG. 5 shows a diagram 300 illustrating a received power (according to the first or the second power estimate) of a received signal 301. The received signal 301 is a super-position of a communication signal 302 and an intermittent interference 303. The communication signal is a signal used by the communication system (to which the device 100 connects). Communication information for the device 100 is encoded in the communication signal 302. The communication signal 302 is the "desired" signal of the device 100. The device 100 aims at continuously receiving the communication signal 302. The intermittent interference 303 exhibits a series of bursts 304, 306, 308 occurring at times $t_1, t_2, t_3$, respectively. In a general scenario, the bursts are stochastic in both occurrence and duration. An entropy measure of the interference (as a distribution of received power in at least one of time and frequency) might quantify a predictability of the bursts. The entropy measure for the intermittent interference (as illustrated in the lower half of FIG. 5) may range from 1 (e.g., for a Poisson process of bursts) to 0 (e.g., for strictly periodic bursts). A receiver gain setting 310 illustrates (in the upper half of FIG. 5) a gain level of the receiver 102.

At time $t_1$ the interference enters the processing chain 148 and the decoding fails, which is indicated with a delay 312 on the decoding result line 138 by the decoding unit 136. Illustration of a delay time (of a few ms) for the delay 312 is exaggerated in the schematic drawing of FIG. 5. In response to the indication, the receiver gain setting 310 is maintained according to the step 225 over a time interval 314. At the end of the burst 304, the received signal 301 entering the processing chain 148 through the receiver 102 essentially corresponds to the communication signal 302. As the step 210 of decoding is continued, the decoding succeeds, which is indicated with a delay 316 on the decoding result line 138 by the decoding unit 136. Consequently, the AGC unit 106 continuously updates the receiver gain setting 310 until a subsequent occurrence of interference according to the step 220. Delays 322 and 324 shown in FIG. 5 for the subsequent bursts 306 and 308, respectively, correspond to the delay 312. Similarly, delays 326 and 328 correspond to the delay 316. The receiver gain setting 310 is thus maintained over time intervals 318 and 320 at each of the bursts 306 and 308, respectively, according to the step 225 of the method 200.

As a numerical example, the received power of the interference 303 is at −30 dBm and the received power of the communication signal 302 is (on average) at −90 dBm. The analog-to-digital converter 112 samples with 10 bits corresponding to an (ideal) dynamic range of 60 dB. Thus, in the presence of the interference (e.g., during one of the bursts 304, 306, 308) a Carrier-to-Interference ratio is −60 dB and successful signal reception it not possible. In the absence of the interference (e.g., during gaps between the bursts), the signal quality is quite good. More importantly, because the method 200 maintains the gain setting 310 of the receiver 102 in the presence of the interference 303, the device 100 can readily receive and successfully decode the communication signal 302 as soon as the interference is absent. As opposed to that, a conventional AGC technique would attenuate the communication signal 302 by 60 dB more than necessary, so that the communication signal 302 and the quantization noise in the analog-to-digital converter 112 were of the same order of magnitude, even in the absence of the interference 303.

Referring back to above-mentioned TDD communication, the intermittent interference 303 may be caused by another TDD communication system. The TDD communication system is an exemplary source of essentially periodic intermittent interference 303. The device 100 can be an LTE User Equipment (UE). The source of the interference 303 (also referred to as interferer) can be another UE operated in an LTE TDD communication system. A frequency of the bursts 304, 306, 308 corresponds to a change of up-link and down-link channels. The bursts 304, 306, 308 correspond to transmissions of the other UE. The gaps between the bursts 304, 306, 308 correspond to times in that the other UE in the TDD communication system is receiving. In the example, the gaps have a duration on the order of 2 ms, which is much shorter than a time-constant conventionally used for AGC. As a consequence, a conventional gain setting would be determined by the maximum signal power, which is the received power of the bursts 304, 306, 308, also in between the bursts 304, 306, 308 of the intermittent interference 303. The device 100 and the method 200 avoid such misadjustments by means of the AGC unit 106, which only updates the receiver gain 310 in case the decoding was successful according to the steps 215, 220, 225.

As an illustrative first scenario, the device 100 receives the communication signal 303 in a down-link using LTE Band 7. Band 7 is located in frequency space from 2620 MHz to 2690 MHz. At the same time, the interferer uses LTE Band 38 within the vicinity of the device 100. Band 38 is located in frequency space from 2570 MHz to 2620 MHz. Because the two frequency bands are adjacent carrying communication links (of the device 100 and the interferer) that are completely uncoordinated, the signal reception of the device 100 in Band 7 can be significantly affected by the communication on Band 38. As can be gathered from FIG. 5, only a (temporal) fraction of the received signal is lost. Performing AGC according to the method 200, the device 100 is in principle able to correctly receive and decode the communication signal 302 in the gaps, since the receiver 102 is working properly when the interference is absent.

In an illustrative second scenario for random intermittent interference, the device 100 is a UE using Band 40. Band 40 is located in frequency space between 2300 MHz and 2400 MHz. If a Wireless Local Area Network (WLAN) access point, located close to the UE, is transmitting, the interference generated by the WLAN access point will be non-regular. Therefore an occurrence of (future) intermittent interference is not easily predictable by the device 100. By virtue of the method 200, the device can detect the presence of the interference "on a burst-by-burst basis".

Figure 6:
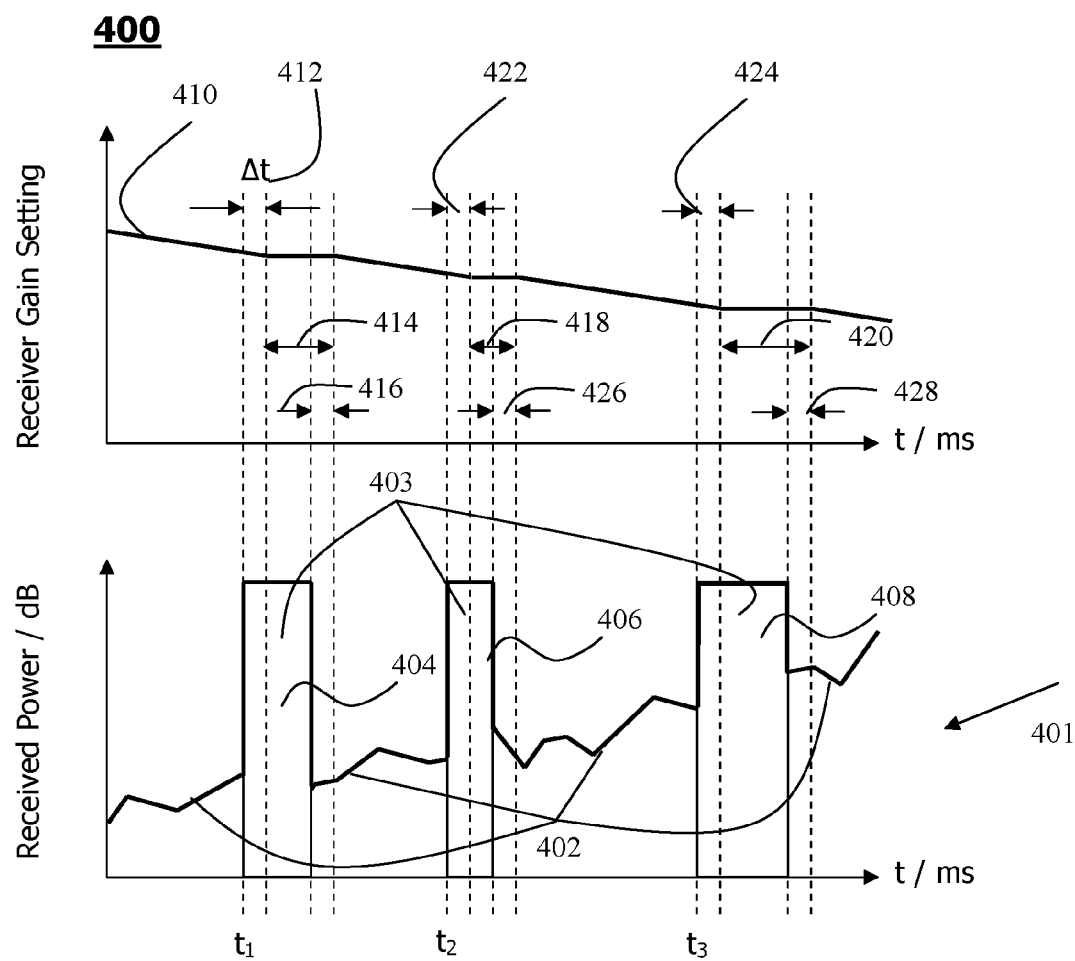
FIG. 6 is a diagram schematically illustrating the receiver gain setting for varying signal power in the presence of intermittent interference.

FIG. 6 shows a diagram 400 illustrating a receiver gain setting 410 as a function of time. Like reference signs in the diagrams 300 and 400 refer to corresponding features, as described above with reference to FIG. 5. The receiver gain setting 410 is determined by the AGC unit 106 in response to a received signal 401. Interference 403 comprised in the received signal 401 exhibits bursts 404, 406, 408 similar to the interference 303. The received signal 401 differs from the received signal 301 of diagram 300 in that the received power of a communication signal 402 in the received signal 401 increases on (temporal) average.

In response to the indication of the presence of the intermittent interference 403 on the indication line 146 (i.e. during time intervals 414, 418 and 420), the AGC unit 106 maintains the gain setting 410 at a constant value according to the step 225. Outside of the time intervals 414, 418 and 420, the AGC unit 106 continuously updates the gain setting according to the step 220. The gain setting is updated based on a measurement of received power of the received signal or another signal on a carrier transmitting the received signal 401. The updating is delayed by the delay times 412, 422, 424 with respect to the received power of the currently received signal 401.

The delay times 412, 422, 424 essentially correspond to a decoding time (required for the at least partial decoding of the decoding unit 136 or the decoding evaluation unit 152). The delay times 412, 422, 424 are on the order of few ms. Typically, the delay times are in the range of 1 ms to 4 ms, preferably equal to one or two subframes of the wireless communication. In a preferred embodiment, the delay times are approximately 2 ms.

Figure 7:
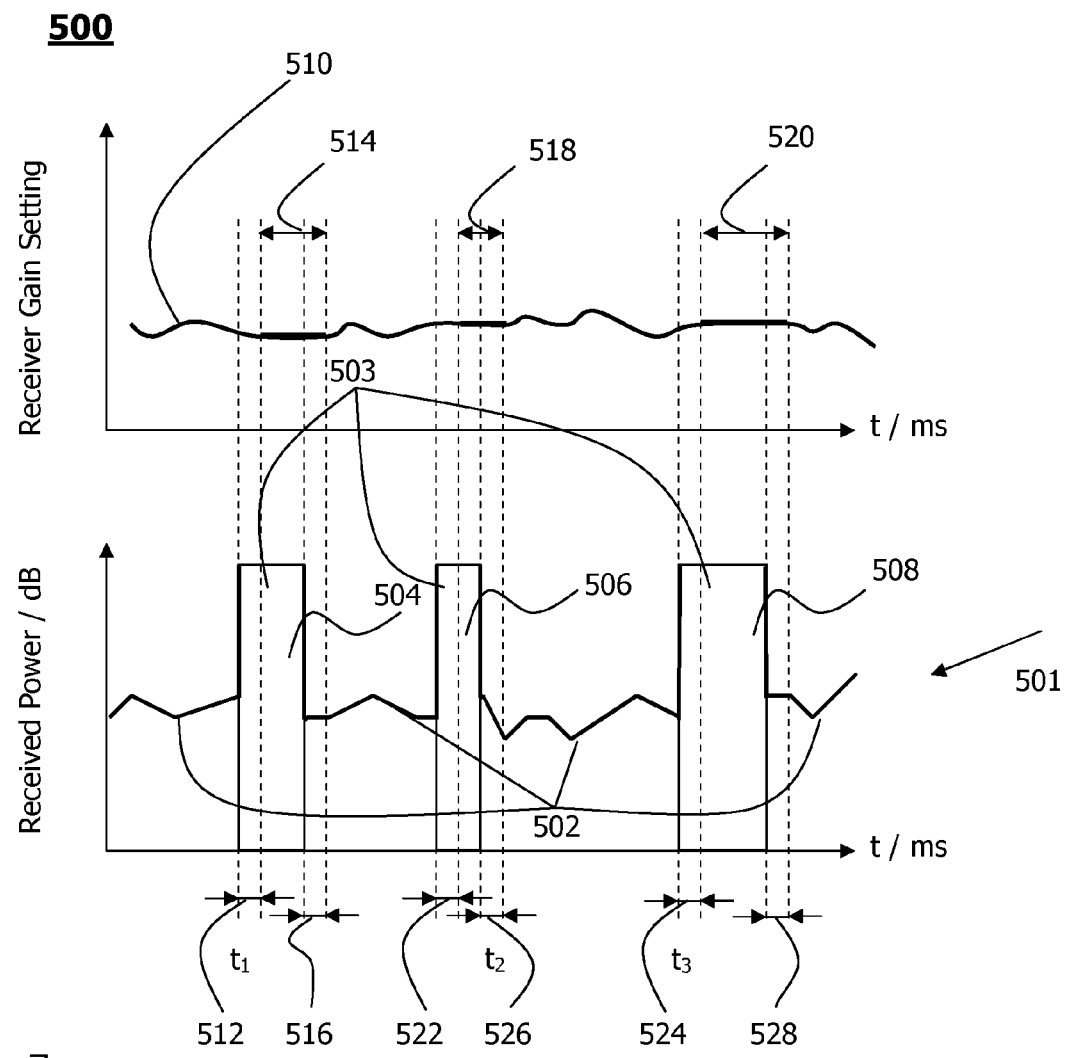
FIG. 7 is a diagram schematically illustrating the receiver gain setting based on an integration time in the presence of intermittent interference.

The delay times are significantly shorter than an integration time of the AGC unit 106. As an advantage, the AGC unit 106 can suppress fluctuations in the gain setting (by the averaging) and can still maintain or update the gain setting in response to the intermittent interference. FIG. 7 shows a further diagram 500 of the gain setting resulting from the method 200 performed by the device 100. The AGC unit 106 is further adapted to integrate the power estimates over time in or prior to the step 220. The integration can be an even averaging or weighted averaging. The gain setting is derived based on the integrated power estimates in conjunction with switching, based on the indications, between the updating (step 220) and the maintaining (step 225) of the gain setting. The integration time (also referred to as an averaging time or a time-constant of the AGC unit 106) is on the order of 100 ms or approximately corresponds to 10 radio frames of the wireless communication.

Figure 8:
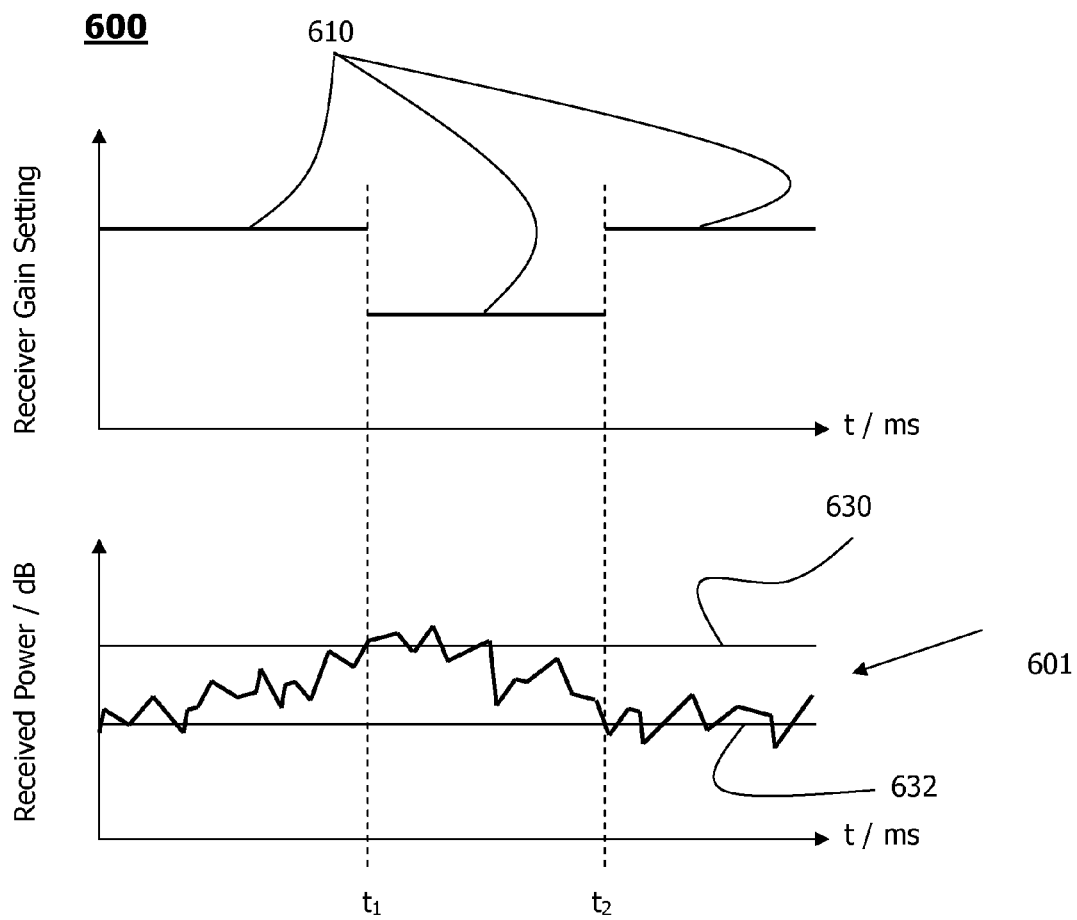
FIG. 8 is a diagram schematically illustrating the receiver gain setting based on a hysteretic analysis of received power.

The method 200 can be combined with a hysteretic updating of a gain setting 610 as shown in diagram 600 of FIG. 8. To this end, the step 220 of updating the gain setting performed by the AGC unit 106 includes comparing the received power with an upper threshold value 630 and a lower threshold value 632. The gain setting is not updated until the received power reaches one of the upper threshold value 630 and a lower threshold value 632. In further extended embodiments of the device 100 and the method 200, the upper threshold value 630 and the lower threshold value 632 are also updated (whenever the gain setting 610 is updated). Preferably, the upper threshold value 630 and the lower threshold value 632 are a function of the (current) gain setting 610 (previous to the updating). As an advantage, the gain setting 610 is not discontinuous.

In still further extended embodiments of the device 100 and the method 200, the received power estimate (that is compared to the thresholds) in the hysteretic updating step 220 is an averaged power estimate. Thus, a time-averaged and hysteretic AGC is realized that is resistance to intermittent interference.

The technique may improve signal reception in cases the device 100 (particularly the receiver 102) and the interferer are co-located. Co-location includes the case of the receiver 102 and the interferer being stationary and arranged in close proximity. Co-location further includes the case of the receiver 102 and interferer being arranged within one housing of the device 100. The latter is a common situation in cellular phones comprising a GPS receiver. The techniques can be used to control the receiver gain of the GPS receiver. In the cases of co-location, at least some knowledge of the (potential) interferer can be used by the AGC unit 106 for switching between the steps 220 and 225. As an example, the switching can (in addition to the indications) be based on a schedule of events of the interferer. The events can include a transmission or a channel change of the interferer. As a further example, the AGC unit 106 can perform the step 225 in responds to the interferer signalling the event to the AGC unit 106.

As has become apparent from the above embodiments of the device 100 and the method 200, the technique can significantly improve signal reception for a device receiving the signal in the presence of strong intermittent interference. The interference may be generated by an interferer in close proximity of the device 100. As a further advantage, while some embodiments may benefit from co-location, the technique does not necessarily rely therein. As a still further advantage, while some embodiments may benefit from predictable (e.g., periodic) interference, the technique does not necessarily rely on predictability.

Furthermore, the technique can be applied to a multi-carrier communication system scheduling measurement gaps for inter-carrier measurements. As an example, the device 100 can receive on a first carrier frequency and tune during short measurement intervals to another second carrier frequency for performing measurements. The signal power on the first and second frequency can be different. The AGC unit 106 is adapted to apply the steps 220 and 225 of updating and maintaining the gain setting using two different gain settings for the first and the second carrier frequency, respectively.

Although the proposed technique for controlling a gain of a receiver is explained by means of LTE communication system and/or using a mobile terminal device, the proposed technique is not limited to LTE communication systems. In principle, the proposed technique may be used in any other communication system having dynamically varying input signals. Moreover, while the embodiments focus on OFDM-based downlink transmission, the present technique can also be used in an uplink direction (e.g., in a base station receiver) in which, in LTE and similar systems, SC-FDMA is used.

Although embodiments of the proposed technique have been illustrated in the accompanying drawings and described in the description, it will be understood that the invention is not limited to the embodiments disclosed herein. In particular, the proposed technique is capable of numerous rearrangements, modifications and substitutions without departing from the scope of the invention as set forth and defined by the following claims.

The invention claimed is:

1. A method of performing Automatic Gain Control, AGC, for a receiver of a device connected to a communication system, the method comprising:
   receiving a signal using a gain setting of the receiver;
   at least partially decoding the received signal to obtain a decoding result, the decoding result indicating at least one of success and failure of the decoding; and
   selecting the gain setting based on the decoding result, the selecting of the gain setting including maintaining the gain setting of the receiver in a presence of an interference in the received signal, the failure of the decoding indicating the presence of the interference.

2. The method of claim 1, wherein selecting the gain setting comprises:
   updating the gain setting of the receiver in an absence of an interference in the received signal, the success of the decoding indicating the absence of the interference.

3. The method of claim 2, further comprising:
   estimating a signal-to-noise ratio of the received signal, the signal-to-noise ratio further indicating at least one of a presence and an absence of the interference.

4. The method of claim 2, further comprising:
   estimating an error rate of the received signal, the error rate further indicating at least one of a presence and an absence of the interference.

5. The method claim 2, further comprising:
   determining a Fourier component of the received signal at a predefined interference frequency or in a predefined interference spectrum, the Fourier component further indicating at least one of a presence and an absence of the interference.

6. The method of claim 2, wherein predefined interference patterns are stored in a memory of the device, the method further comprising:
   matching the received signal to each of a plurality of the predefined interference patterns.

7. The method of claim 2, further comprising:
   periodically measuring received power, wherein an increase of the received power within one period, two periods or few periods further indicates the presence of the interference.

8. The method of claim 7, wherein the gain setting is updated based on at least one of a hysteretic analysis of the received power and an integration time of the received power.

9. The method of claim 2, wherein the gain setting is updated based on a measurement of received power, wherein the updating is delayed with respect to the measurement by a delay time.

10. The method of claim 2, wherein the indications are at least one of numerically weighted and logically combined.

11. The method of claim 2, wherein the received signal is transmitted on a control channel of the communication system.

12. The method of claim 2, wherein the gain setting is applied to the receiver at different stages of a receiver path in the device, including at least one of a stage in the receiver and a stage prior to an analog-to-digital converter.

13. The method of claim 1, wherein maintaining the gain setting includes at least one of:
   (a) a suppressed change of the gain setting, wherein the suppressed change is equal to or less than half of a conventional AGC response; and
   (b) a transient change of the gain setting, wherein the gain setting is continuously updated and returns to a prior gain setting in case the failure of the decoding indicates the presence of the interference.

14. A non-transitory computer readable storage medium storing executable instructions, which when executed by a processor on a device, causes the device to:
   receive a signal using a gain setting of the receiver;
   at least partially decode the received signal to obtain a decoding result, the decoding result indicating at least one of success and failure of the decoding;
   select the gain setting based on the decoding result, the selecting of the gain setting including maintaining the gain setting of the receiver in a presence of an interference in the received signal, the failure of the decoding indicating the presence of the interference.

15. A device for performing Automatic Gain Control, or AGC, for a receiver of the device connected to a communication system, the device comprising:
   a receiver configured to receive a signal using a gain setting of the receiver;
   a decoding unit configured to at least partially decode the received signal to obtain a decoding result, the decoding result indicating at least one of success and failure of the decoding; and
   an AGC unit configured to select the gain setting based on the decoding result, the AGC unit is configured to select the gain setting at least by maintaining the gain setting of the receiver in a presence of an interference in the received signal, the failure of the decoding indicating the presence of the interference.

16. The device of claim 15, wherein the AGC unit is configured to select the gain setting by updating the gain setting of the receiver in the absence of an interference in the received signal, the success of the decoding indicating the absence of the interference.

* * * * *

UNITED STATES PATENT AND TRADEMARK OFFICE
CERTIFICATE OF CORRECTION

| | |
|---|---|
| PATENT NO. | : 9,143,177 B2 |
| APPLICATION NO. | : 14/007679 |
| DATED | : September 22, 2015 |
| INVENTOR(S) | : Wilhelmsson et al. |

It is certified that error appears in the above-identified patent and that said Letters Patent is hereby corrected as shown below:

In the Claims

In Column 15, Line 40, in Claim 5, delete "method claim" and insert -- method of claim --, therefor.

Signed and Sealed this
Nineteenth Day of April, 2016

Michelle K. Lee
*Director of the United States Patent and Trademark Office*